United States Patent [19]
Mochizuki

[11] Patent Number: 5,614,743
[45] Date of Patent: Mar. 25, 1997

[54] MICROWAVE INTEGRATED CIRCUIT (MIC) HAVING A REACTANCE ELEMENT FORMED ON A GROOVE

[75] Inventor: Masao Mochizuki, Yokohama, Japan

[73] Assignee: Kabushiki Kaisha Toshiba, Kawasaki, Japan

[21] Appl. No.: 505,627

[22] Filed: Jul. 21, 1995

[30]  Foreign Application Priority Data

Jul. 26, 1994 [JP] Japan .................................. 6-173923
Jul. 12, 1995 [JP] Japan .................................. 7-176382

[51] Int. Cl.$^6$ .................... H01L 29/80; H01L 31/112; H01P 3/08; H01P 1/00
[52] U.S. Cl. .................... 257/276; 257/275; 257/728; 233/246; 233/247
[58] Field of Search .................... 257/275, 276, 257/277, 301, 302, 303, 304, 306, 307, 308, 309, 528, 531, 532, 533, 534, 728; 333/246, 247

[56]  References Cited

U.S. PATENT DOCUMENTS 5,351,163  9/1994  Dawson et al. .................... 257/532

Primary Examiner—Carl Whitehead, Jr.
Attorney, Agent, or Firm—Oblon, Spivak, McClelland, Maier & Neustadt, P.C.

[57]  ABSTRACT

MMIC elements are formed on the surface of a GaAs semiconductor substrate. Rectangular U grooves having V-shaped bottoms are formed on the bottom surface of the substrate up to the surface of the substrate under the electrode and ground terminals of the MMIC elements. MIM capacitors and coils are formed on the side walls of the grooves and the bottom surface of the substrate and are connected to the electrode and ground terminals. This arrangement provides the MIM capacitors with large capacitance and the coils with large inductance without increasing chip size.

20 Claims, 16 Drawing Sheets

MICROWAVE INTEGRATED CIRCUIT (MIC) HAVING A REACTANCE ELEMENT FORMED ON A GROOVE

BACKGROUND OF THE INVENTION

1. Field of the Invention

The present invention relates to an integrated circuit such as a monolithic microwave integrated circuit (hereinafter referred to as MMIC) and a method of manufacturing the same. In particular, the present invention relates to an MMIC made of, for example, gallium arsenide (GaAs), capable of providing required capacitance or inductance without increasing chip size, and a method of manufacturing such an MMIC.

2. Description of the Prior Art

GaAs devices achieve both low noise and low distortion characteristics, as well as low power consumption at high frequencies over the UHF band. Thus, GaAs devices have been used widely in TV and CATV tuners and broadcasting satellite receivers. These features are extremely important to mobile communication systems such as cellular cordless phones.

Much concern has been devoted to reducing the mounting area for the components in the mobile communication systems, so as to make the system smaller. So far, many inductors, resistors, and capacitors are placed at the periphery of a GaAs IC, so that the mounting area is increased. An extremely large area will be required for the capacitors or the inductors, if the conventional SiN slab capacitors or spiral inductors are to be integrated in an IC. For that reason, typical GaAs MMICs until now have been supplied with additional pins for these lumped circuit elements. These additional pins end up with increasing the total number of components.

An MMIC made of GaAs or S1 employs, as a bypass capacitor, an MIM (metal-insulator-metal) capacitor consisting of two wiring metal electrodes and an insulation film held between the electrodes. The capacitance of the MIM capacitor is in proportion to the facing areas of the electrodes and in inverse proportion to the distance between the electrodes. To increase the capacitance of the MIM capacitor, therefore, it is necessary to increase the area of each electrode, or thin the insulation film between the electrodes. Increasing the area of each electrode will increase chip size because the MIM capacitor is usually formed flat on the surface of a semiconductor substrate. On the other hand, thinning the insulation film will cause pinholes.

To solve this problem, Japanese Examined Patent Publication No. 5-73273 discloses a technique shown in FIG. 1. An insulation film 102 is grown on a GaAs substrate 101 and is shaped into a stepped pattern. The patterned insulation film 102 is used as a mask to form V-shaped grooves on the substrate 101 by anisotropic etching. Along the grooves and insulation film 102, there are formed a lower electrode 103, an insulation film 104, and an upper electrode 105, to form MIM capacitors. The electrodes of each of the MIM capacitors have large facing areas to provide large capacitance in comparison with a relatively small area occupied by the capacitors on the substrate.

The prior art of FIG. 1, however, increases chip size when it is adopted for a GaAs MMIC because not only active and passive elements but also the patterned insulation film 102 must be arranged on the surface of the substrate 101.

FIG. 2A shows an example of a spiral coil used for an MMIC. The inductance of the coil is approximated as follows:

$$L(nH) = 393 \frac{a^2 n^2}{8a + 11c} \tag{1}$$

where n is the number of windings of the coil, a is a mean radius, i.e., $a=(dO+di)/4$ of the coil, and $c=(dO+di)/2$. FIG. 2B shows a rectangular spiral coil whose inductance is approximated as follows:

$$L(nH)=8.5nS^{5/3}S^{1/2} \tag{2}$$

where S is the area (cm2) of the coil. The equations (1) and (2) are, for example, discussed in some detail in chapter 2 of Microwave Components, Devices and Active Circuits, by P. F. Combes, J. Graffeuil and J-F. Sautereau, published 1987 by John Wiley & Sons Ltd. To increase the inductance, the area S of the coil must be increased. Increasing the area of the coil, however, increases the area of the chip. Consequently, the prior art is incapable of providing a small coil with large inductance.

FIG. 3 shows a spiral coil according to a prior art. The coil 56 is made of wiring metal 56a. A center end of the coil 56 is connected, through a contact hole 56b, to an MIM capacitor 57, which is formed on the surface of a semiconductor substrate, to thereby combine conductance L and capacitance C into reactance. The MIM capacitor 57 has a lower electrode layer 57a connected to the ground, an upper electrode layer 57b connected to the coil 56 through the contact hole 56b, and an insulation layer 57c between the electrodes 57a and 57b. The coil and MIM capacitor have each a large area as mentioned above.

FIG. 5 shows a semiconductor substrate of an MMIC. Reactance elements such as those of FIGS. 2A, 2B, and 3 are arranged flat on the substrate. FIG. 4 shows an equivalent circuit of the arrangement of FIG. 5. Coils $L_1$ and $L_2$ connected between a power source $V_{DD}$ and the drains of FETs occupy a large area. Similarly, bypass MIM capacitors C2 and C4 connected between the sources of the FETs and the ground occupy a large area.

SUMMARY OF THE INVENTION

An object of the present invention is to provide an MMIC made of GaAs or Si capable of providing MIM capacitors with large capacitance and coils with large inductance without increasing chip size, and a method of manufacturing such an MMIC. Another object of the present invention is to fabricate an integrated circuit such as one shown in FIGS. 7 and 9 having improved high-frequency and output characteristics.

In order to accomplish the objects, the present invention provides an integrated circuit (IC) having, as shown in FIG. 6A, a semiconductor substrate i made of GaAs or Si, active elements such as transistors 2 and 3 formed on the surface of the substrate 1, grooves 21, 22, and 23 formed on the bottom surface of the substrate 1 up to the surface thereof, and reactance elements such as MIM capacitors and coils formed in the grooves or around the grooves on the bottom surface of the substrate 1. In FIG. 6A, each of the MIM capacitors formed in the grooves 21 and 22 consists of a lower electrode layer 24a, an insulation film 24b, and an upper electrode layer 24c. The coils (86, 87) may be formed around the grooves on the bottom surface of the substrate 1 as shown in FIGS. 11A and 11C. Forming the reactance elements on the bottom surface of the substrate 1 and in the grooves improves the area efficiency of the principal surface of the substrate 1 on which the active elements are formed.

Accordingly, the present invention provides the MIM capacitors with required capacitance and the coils with required inductance without increasing chip size. In FIG. 6A, a wiring layer 24c on the bottom surface of the substrate 1 forms an ohmic contact with respect to the substrate 1 through a contact hole 25, and the ohmic contact is connected to a ground terminal 11 formed on the surface of the substrate 1. This arrangement prevents a rise of ground potential and improves the high-frequency characteristic of the IC. The active elements formed on the surface of the substrate 1 may be FETs such as Metal Semiconductor Field Effect Transistors (MESFETs) and Metal-Insulator-Semiconductor FETs (MISFETs), bipolar transistors such as Heterojunction Bipolar Transistors (HBTs), or Static Induction Transistors (SITs). When the substrate 1 is made of Si, the active elements may be MOSFETs, MOS-SITs, or CMOS transistors. The MICs or ICs of this invention are very useful as a device for next generation hand-held phone and wireless personal communication systems.

The IC of the present invention is easily manufactured according to a method of the present invention shown in FIGS. 8A to 8E and 13A to 13C including the steps of:

(1) forming active elements such as FETs on the surface of a semiconductor substrate 1;

(2) forming grooves 21, 22, and 23 on the bottom surface of the substrate 1 up to the surface thereof; and (3) forming reactance elements such as MIM capacitors and coils in the grooves and around the grooves on the bottom surface of the substrate. The MIM capacitors are easily formed at high yield as shown in FIGS. 8C and 8D through the steps of:

(i) forming a first electrode layer 24a from, for example, titanium (Ti), molybdenum (Mo), and gold (Au) in the grooves 21 and 23;

(ii) forming an insulation film 24b from, for example, $Si_3N_4$ along the first electrode layer 24a; and (iii) forming a second electrode layer 24c from, for example, Ti, Mo, and Au along the insulation film 24b, so that the second electrode layer 24c faces the first electrode layer 24a through the insulation film 24b.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

DETAILED DESCRIPTION OF THE EMBODIMENTS

Figure 1:
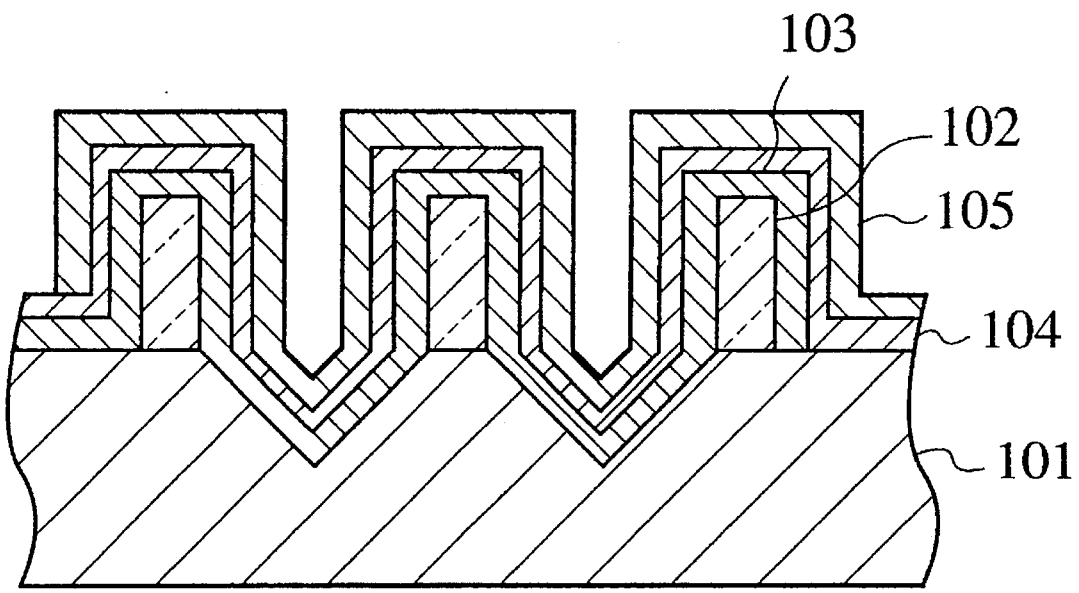
FIG. 1 shows MIM capacitors of an MMIC according to a prior art.
Figure 2A:
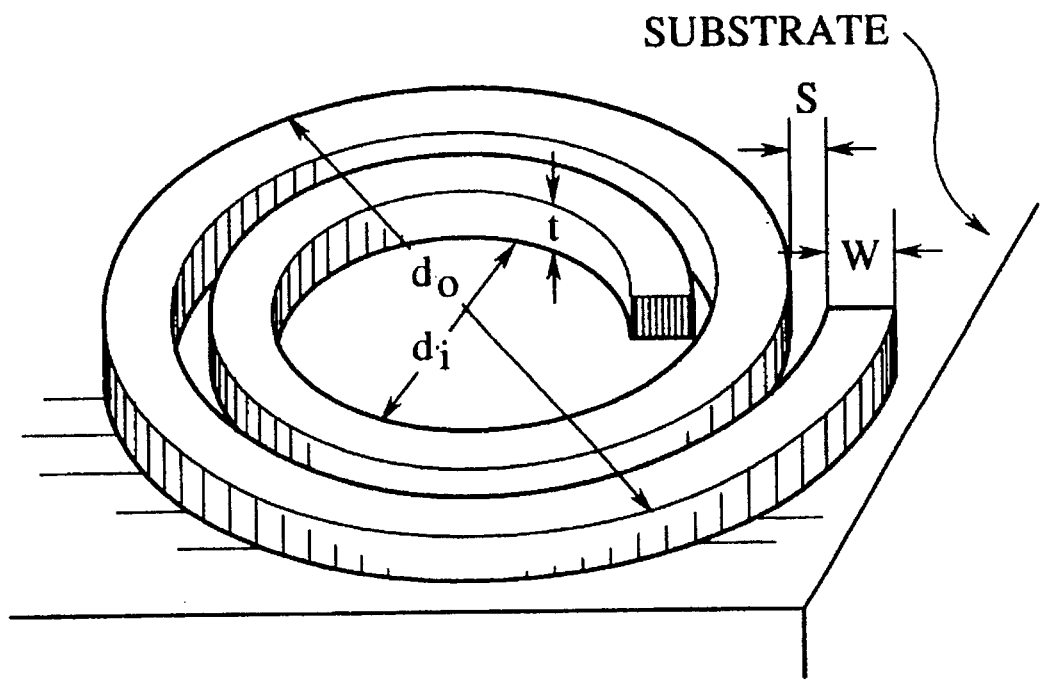
FIGS. 2A and 2B show coils of an MMIC.
Figure 2B:
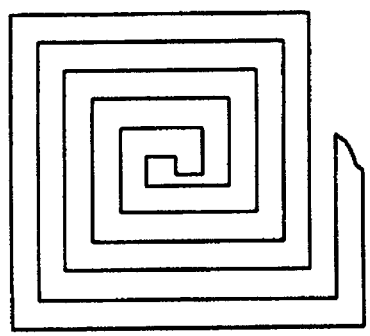

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Figure 6A:
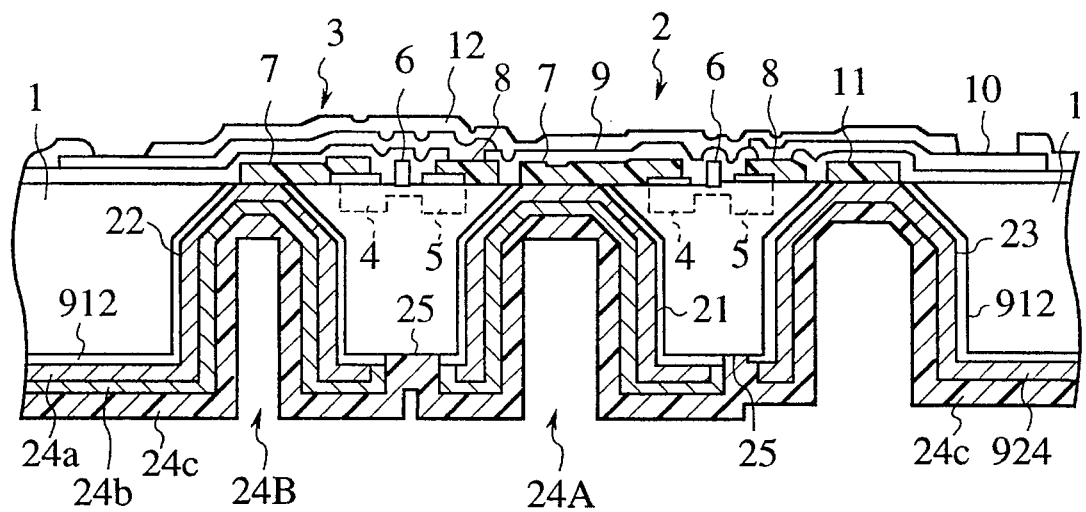
FIGS. 6A and 6B are sectional and top surface views showing a GaAs MMIC according to a first embodiment of the present invention.
Figure 6B:
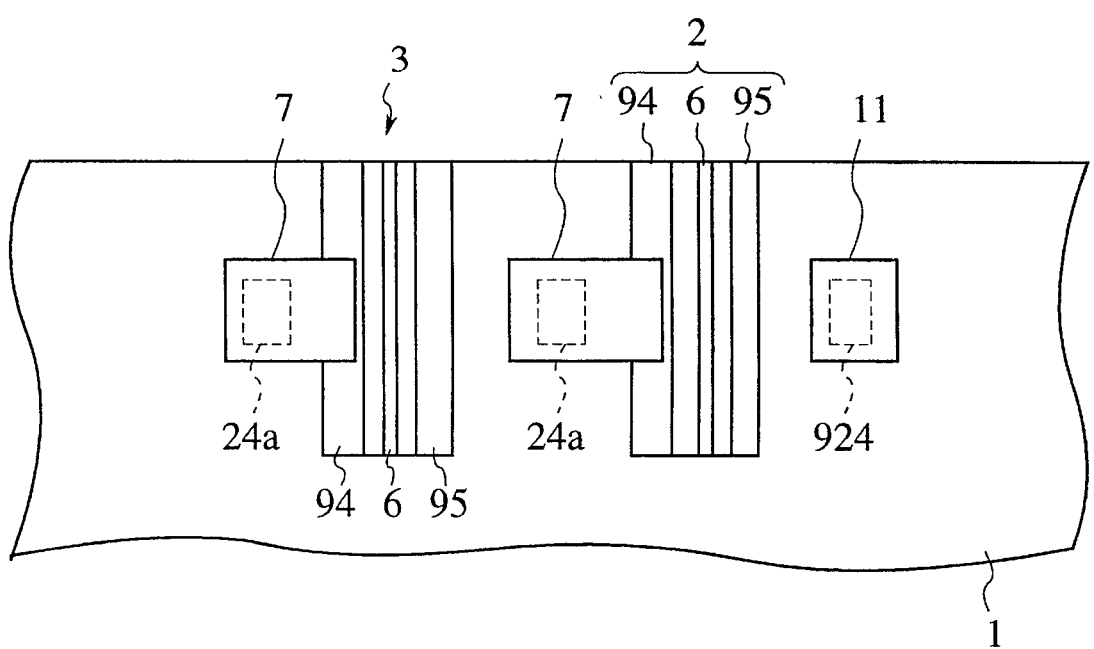

FIGS. 6A and 6B show a GaAs MMIC according to the first embodiment of the present invention, in which FIG. 6A is a sectional view and FIG. 6B is a plan view showing essential parts on the top surface of a substrate.

In FIG. 6A, the MMIC has FETs 2 and 3 formed on the surface of the semi-insulating GaAs substrate 1. The FET 2 is an MESFET having an $n^+$ source region 4 and an $n^+$ drain region 5 both diffused in the substrate 1. The $n^+$ source and drain regions may be formed on the epitaxial layer on the substrate 1. The doping concentration in the $n^+$ source region 4 and $n^+$ drain region 5 may be $5 \times 10^{17}$ cm$^{-3}$ to $5 \times 10^{18}$ cm$^{-3}$, for example. A metal gate electrode 6 is formed between the source and drain regions 4 and 5. The source region 4 is connected to a source electrode terminal 7, and the drain region 5 is connected to a drain electrode terminal 8. The gate electrodes of the MESFETs 2 and 3 are made of, for example, Ti (titanium), Pt (platinum), and Au (gold). The n-type channel beneath the gate electrode 6 is doped with a concentration of $1 \times 10^{16}$ to $1 \times 10^{17}$ cm$^{-3}$. The gate electrode 6, source electrode terminal 7, and drain electrode terminal 8 are covered with an interlayer insulation film 9, which may be an $SiO_2$ film or an $Si_3N_4$ film. The drain electrode terminal 8 is connected to an aluminum wiring layer 10 through a contact hole.

The FETs 2 and 3 may be identical to each other and are GaAs-MESFETs with a ground electrode terminal 11 being formed on the surface of the substrate 1. The FETs 2 and 3 are lastly covered by a protective passivation film 12, which may be an $SiO_2$ film, an $Si_3N_4$ film, or a polyimide film. Vertical grooves (or trenches) 21, 22, and 23 are formed on the bottom surface of the substrate 1 up to the source electrode terminals 7 of the FETs 2 and 3 and the ground electrode 11. The depth of the grooves is 20 to 150 micrometers, the width thereof is 2 to 15 micrometers, and the deepest part thereof is V-shaped. The wall of each of the grooves 21 and 22 is covered with an insulation film 912, a lower electrode layer 24a, an insulation film 24b, and an upper electrode layer 24c in this order, to form MIM capacitors 24A and 24B. The lower electrode layer 24a is connected to the source electrode terminals 7 of the FETs 2 and 3. The insulation film 912 may be omitted when a semi-insulating GaAs substrate is used. The wall of the groove 23 is covered with the insulation film 912, an electrode layer 924, and the upper electrode layer 24c in this order. The electrode layer 924 is connected to the ground electrode terminal 11. The insulation film 912 in the groove 23 may be omitted when a semi-insulating GaAs substrate is used. The upper electrode layer 24c is connected to the substrate 1 through contact holes 25. The lower electrode layer 24a and electrode layer 924 are made of a lamination of Ti, Mo, and Au films of 50, 50, and 500 nanometers thick, respectively. The upper electrode layer 24c is a lamination of Ti, Mo, and Au films of 50, 50, 1500 nanometers thick, respectively. The insulation film 24b is an $Si_3N_4$ (silicon nitride) film of 100 nanometers thick.

Figure 7:
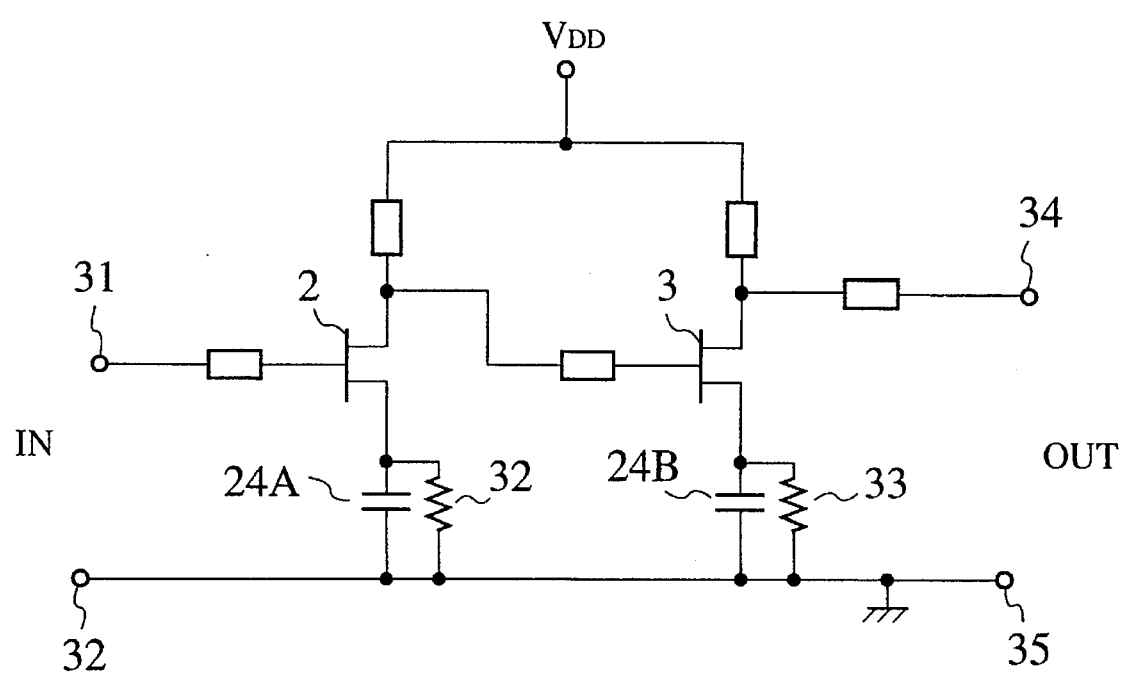
FIG. 7 shows an equivalent circuit of the MMIC of the first embodiment.

FIG. 7 is an equivalent circuit of the GaAs MMIC of FIGS. 6A and 6B. The MMIC has input terminals 32 and 32 for receiving a microwave signal. The input terminal 31 is connected to the gate of the FET 2, and the input terminal 32 is connected to the ground. The source of the FET 2 is connected to the ground through the MIM capacitor 24A serving as a bypass capacitor. The MIM capacitor 24A is connected to a resistor 32 in parallel. The drain of the FET 2 is connected to a power source VD=and to the FET 3. The source of the FET 3 is connected to the ground through the MIM capacitor 24B. The MIM capacitor 24B is connected to a resistor 33 in parallel. The drain of the FET 3 is connected to the power source $V_{DD}$ and to an output terminal 34. An output terminal 35 is connected to the ground. The input terminals 32 and 32 receive a microwave signal whose high frequency is amplified by the two FETs, and the amplified signal is supplied to the output terminals 34 and 35.

FIGS. 8A to 8E show a method of manufacturing the GaAs MMIC of FIGS. 6A and 6B. For the sake of simplicity, the vertical groove 22 of FIG. 6A is not shown in FIGS. 8A to 8E.

Figure 8A:
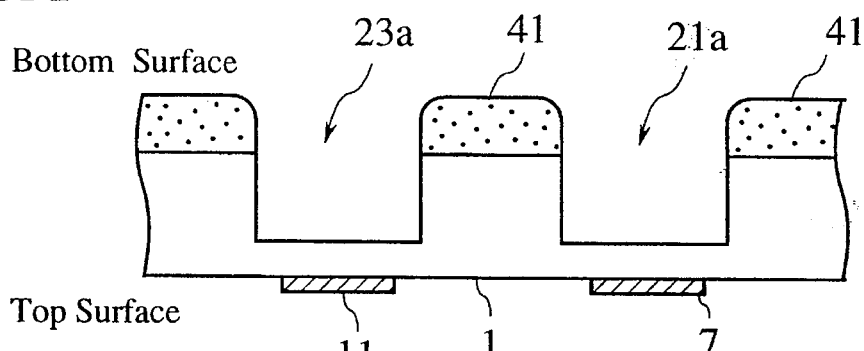
FIGS. 8A to 8E show the steps of manufacturing the MMIC of the first embodiment.

(a) In FIG. 8A, MMIC elements such as FETs 2 and 3 are formed on the surface of a GaAs substrate 1. The GaAs substrate 1 may be an undoped semi-insulating liquid-encapsulated Czochralski (LEC) GaAs, or Cr-doped semi-insulating substrate. The active layer for FETs 2, 3 is grown on a LEC GaAs substrate 1 by MBE. The electrical isolation is carried out by boron ion implantation. Au/Ni/AuGe is formed by an electron-beam evaporation technique for source drain electrode terminals 7, 8. The gate metal of Ti/Pt/Au is evaporated after gate recess etching. The gate length is typically 0.5 μm which is defined by a conventional photolithography technique. A resist layer 41 of, for example, two micrometers thick is applied to both on the top surface and the bottom surface of the substrate 1. The resist layer is patterned by photolithography. The patterned resist layer is used as a mask to carry out selective anisotropic etching such as reactive ion etching (RIE) by chlorine plasma or $BCl_3$ based plasma, to form rectangular U grooves 21a and 23a having a vertical side walls and required depth on the bottom surface of the substrate 1.

Figure 8B:
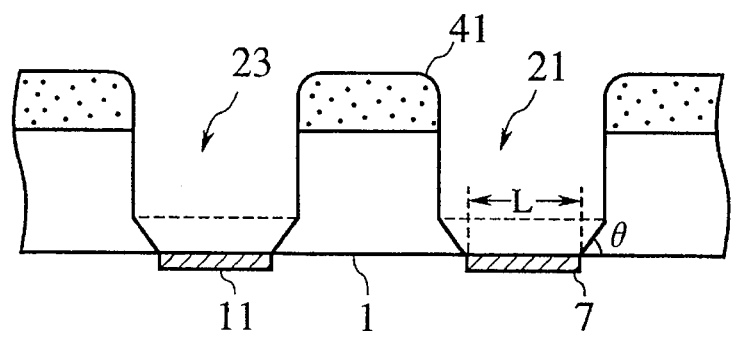

(b) In FIG. 8B, selective isotropic etching is carried out on the bottoms of the rectangular U grooves 21a and 23a up to a ground electrode terminal 11 and a source electrode terminal 7 of the FET 2 on the surface of the substrate 1, so that the side wall of each of the grooves 21a and 23a forms an angle of θ with respect to the surface of the substrate 1. As a result, vertical grooves 21 and 23 each having a V-shaped bottom are formed. The selective isotropic etching may be tartaric-acid-based or bromomethanol($Br_2:CH_3OH$)-based wet etching. The angle θ is determined according to etching conditions such as the kind, composition and temperature of etchant. The angle θ determines the lateral size L of the source electrode terminal 7. Namely, when the etching conditions are set to reduce the angle θ, the lateral size L of the source electrode terminal 7 decreases, and when they are set to increase angle θ, the lateral size L increases. The angle is preferably in the range of 30 to 45 degrees and most preferably 30 degrees. When a (100) plane substrate is used, the tartaric-acid-based etching will easily form an angle θ of 30 degrees.

Figure 8C:
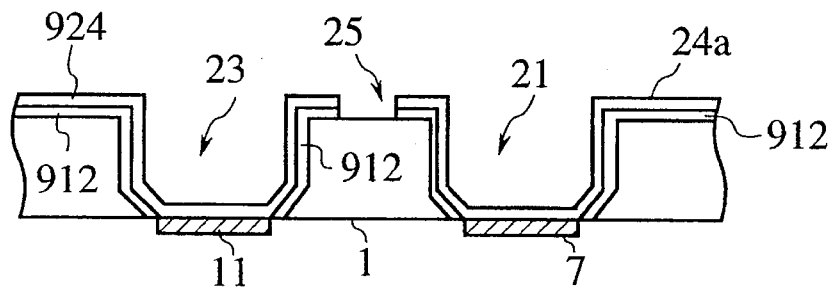

(c) In FIG. 8C, the patterned resist layer 41 is removed, and the substrate 1 is washed. An insulation film 912 of 100 to 300 nanometers thick is formed from $SiO_2$ or $Si_3N_4$ by chemical vapor deposition (CVD) method over the bottom surface of the substrate 1. The insulation film 912 is removed from the bottoms of the grooves 21a and 23a by photolithography. As explained above, the insulation film 912 may be omitted when a semi-insulating GaAs substrate is used. Omitting the insulation film 912 will simplify the manufacturing steps. A resist film used as a mask for etching the insulation film 912 is removed. A Ti film of 50 nanometers thick, an Mo film of 50 nanometers thick, and an Au film of 500 nanometers thick are successively formed by vacuum vapor deposition, to form a lower electrode layer 24a and an electrode layer 924. A part of the lower electrode layer 24a is selectively etched by photolithography or RIE, to form a contact hole 25. At the same time, the lower electrode layer 24a is separated from the electrode layer 924. The contact hole 25 and the separation of the lower electrode layer 24a from the electrode layer 924 may be made by a lift-off method. The Au film may be etched by a solution of Ki and $I_2$. The electrode layer 924 of the Ti, Mo, and Au films is formed on the inner wall of the groove 23 so that it is electrically independent of the lower electrode layer 24a.

Figure 8D:
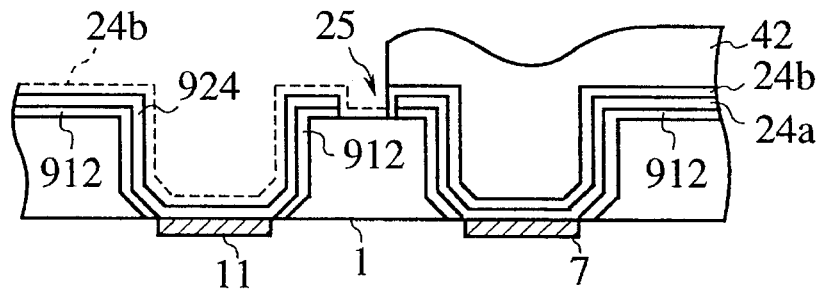
Figure 8E:
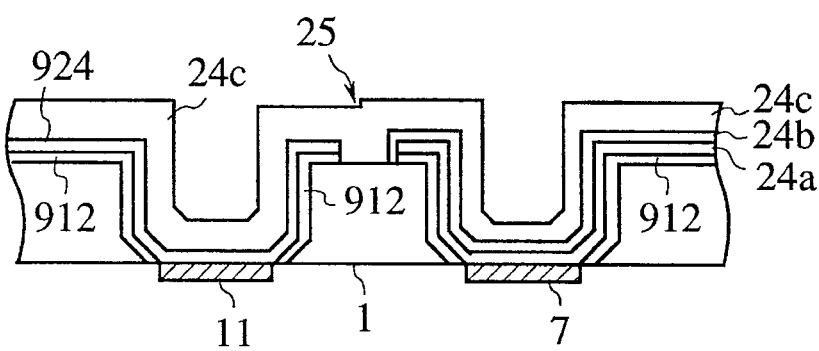

(d) In FIG. 8D, an insulation film 24b of 100 nanometers thick $Si_3N_4$ is formed on the lower electrode layer 24a and the electrode layer 924 by CVD method. A resist pattern 42 is formed and used to selectively etch the insulation film 24b by photolithography with RIE using $CF_4$. The insulation film 24b is removed from the groove 23, contact hole 25, and the peripheries thereof, to secure the opening of the contact hole 25.

(e) In FIG. BE, a Ti film of 50 nanometers thick, an Mo film of 50 nanometers thick, and an Au film of 1.5 micrometers thick are successively formed by vacuum vapor deposition, to form an upper electrode layer 24c over the bottom surface of the substrate 1. This completes the GaAs MMIC shown in FIG. 6A. When the GaAs substrate 1 is a high-resistivity substrate such as a semi-insulating GaAs substrate, $^{28}Si^+$ or $^{29}Si^+$ ions will be implanted through the contact hole 25 before depositing the upper electrode layer 24c, to form a high-concentration ohmic contact region in the contact hole 25. Thereafter, the vacuum vapor deposition of metals for upper electrode layer 24C is carried out.

As mentioned above, the first embodiment forms the FETs on the surface of the GaAs substrate 1, and the vertical grooves 21, 22, and 23 on the bottom surface of the substrate 1. Thereafter, the embodiment forms the MIM capacitors 24A and 24B on the walls of the grooves 21 and 22 and the bottom surface of the substrate 1. As a result, the MIM capacitors have large capacitance in proportion to the area of the bottom surface of the substrate 1, i.e., the sum of the surfaces of the grooves 21 and 22 and the bottom surface of the substrate 1 without increasing chip size. Since the lower electrode layer 24a is formed over the bottom surface of the substrate 1, the capacitance of the MIM capacitors 24A and 24B is further increased. The upper electrode layer 24c is connected to the bottom surface of the substrate 1 through the contact holes 25 and to the ground terminal 11 of the MMIC, to prevent a rise of ground potential, which may occur in a high-frequency small signal amplification device due to high resistance, to thereby stabilize high-frequency signals. Since the upper electrode layer 24c serving as a ground electrode is extended all over the bottom surface of the substrate 1, the operation of the MMIC is stabilized. The MMIC according to the first embodiment of the present invention improves the capability, performance and reliability of microwave circuits while reducing size, weight, and cost.

Figure 9:
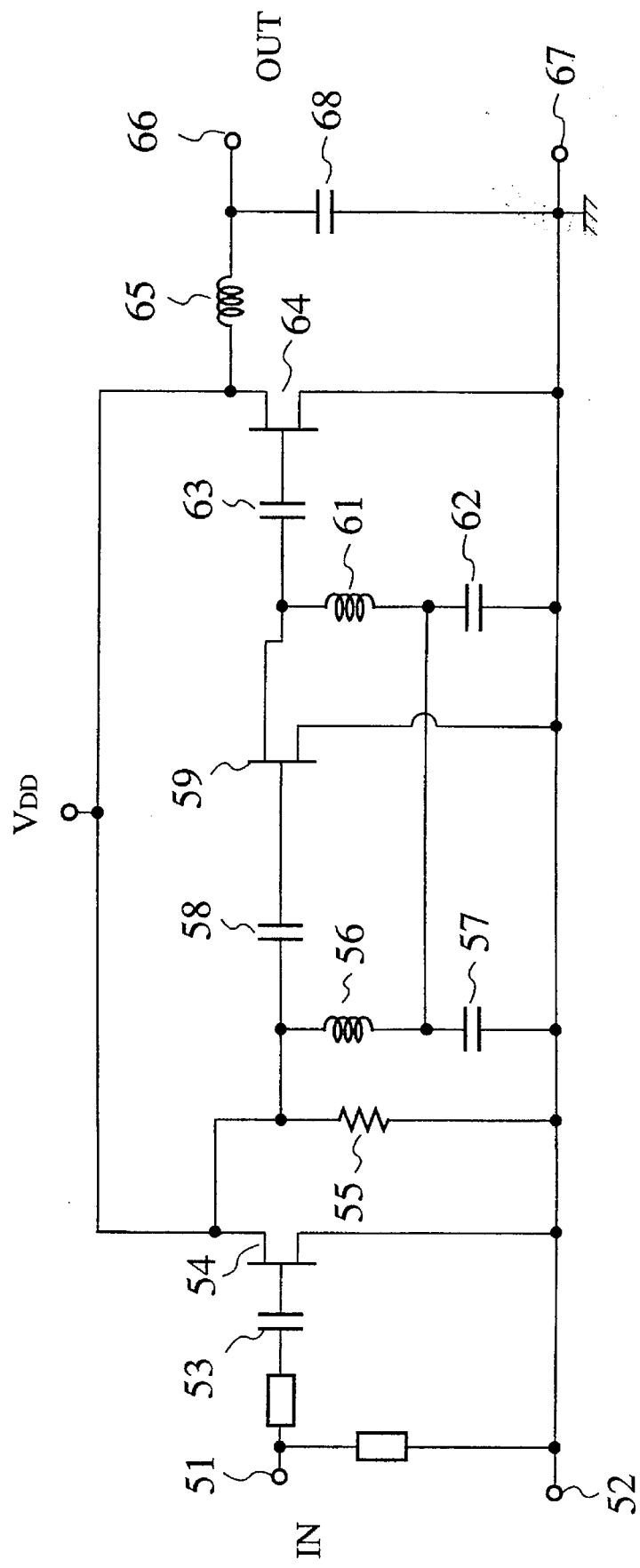
FIG. 9 shows an equivalent circuit of a GaAs MMIC according to a second embodiment of the present invention.
Figure 10:
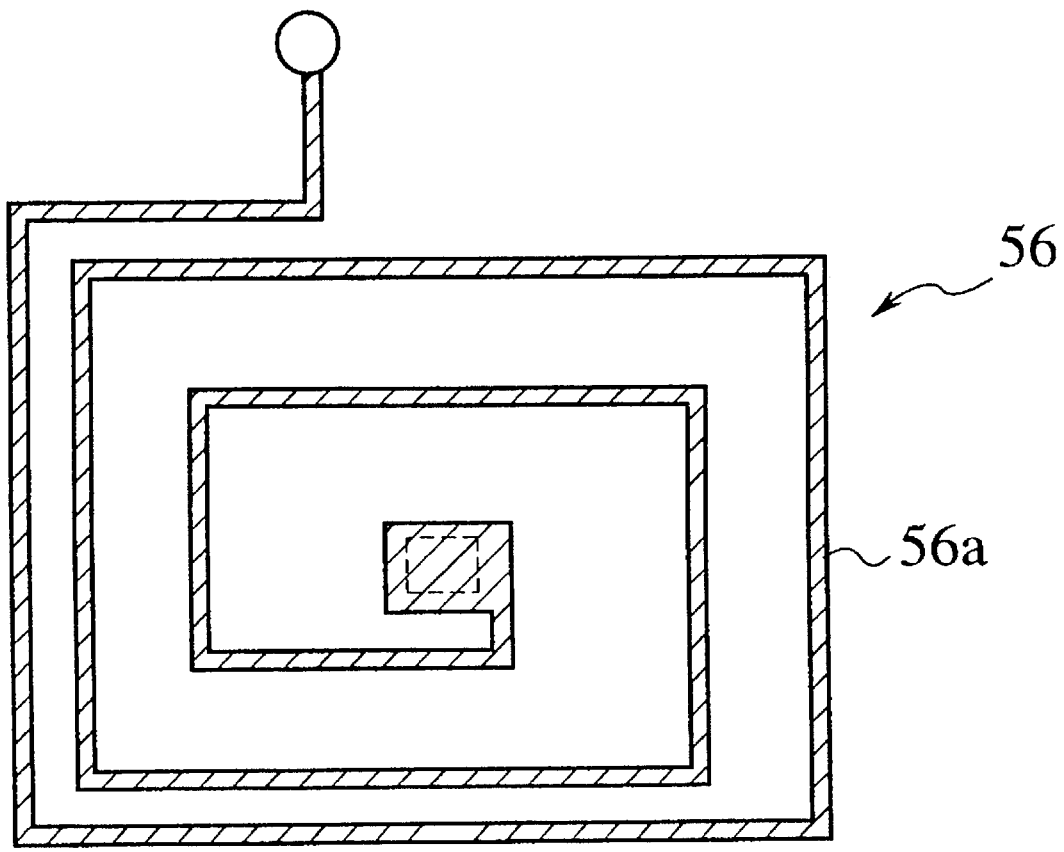
FIG. 10 shows a reactance element of the MMIC of the second embodiment, having the same function as the prior art of FIG. 3.

FIGS. 9 and 10 show an MMIC according to the second embodiment of the present invention. The first embodiment connects an MIM capacitor on the bottom surface of a GaAs substrate to the source electrode terminal of an FET on the surface of the substrate. Instead, the second embodiment connects an MIM capacitor on the bottom surface of a GaAs substrate to a coil on the surface of the substrate. In FIG. 9, the MMIC of the second embodiment has input terminals 51 and 52 for receiving a microwave signal. The input terminal 51 is connected to the gate of a first FET 54 through a capacitor 53. The source of the FET 54 is connected to the ground. The FET 54 may be a GaAs MESFET or High Electron Mobility Transistor (HEMT). The drain of the FET 54 is connected to a power source $V_{DD}$, to the ground through a resistor 55, to the ground through a coil 56 and an MIM capacitor 57, and to the gate of an intermediate FET 59 through a capacitor 58. The source of the FET 59 is connected to the ground, and the drain thereof is connected to the ground through a coil 61 and an MIM capacitor 62 and to the gate of an output FET 64 through a capacitor 63. The drain of the FET 64 is connected to the power source $V_{DD}$ and to an output terminal 66 through a coil 65. The source of the FET 64 is connected to an output terminal 67, which is connected to the ground. An MIM capacitor 68 is connected between the output terminals 66 and 67. A microwave signal is received by the input terminals 51 and 52, is amplified by the three FETs 54, 59, and 64, and is supplied to the output terminals 66 and 67.

Figure 3:
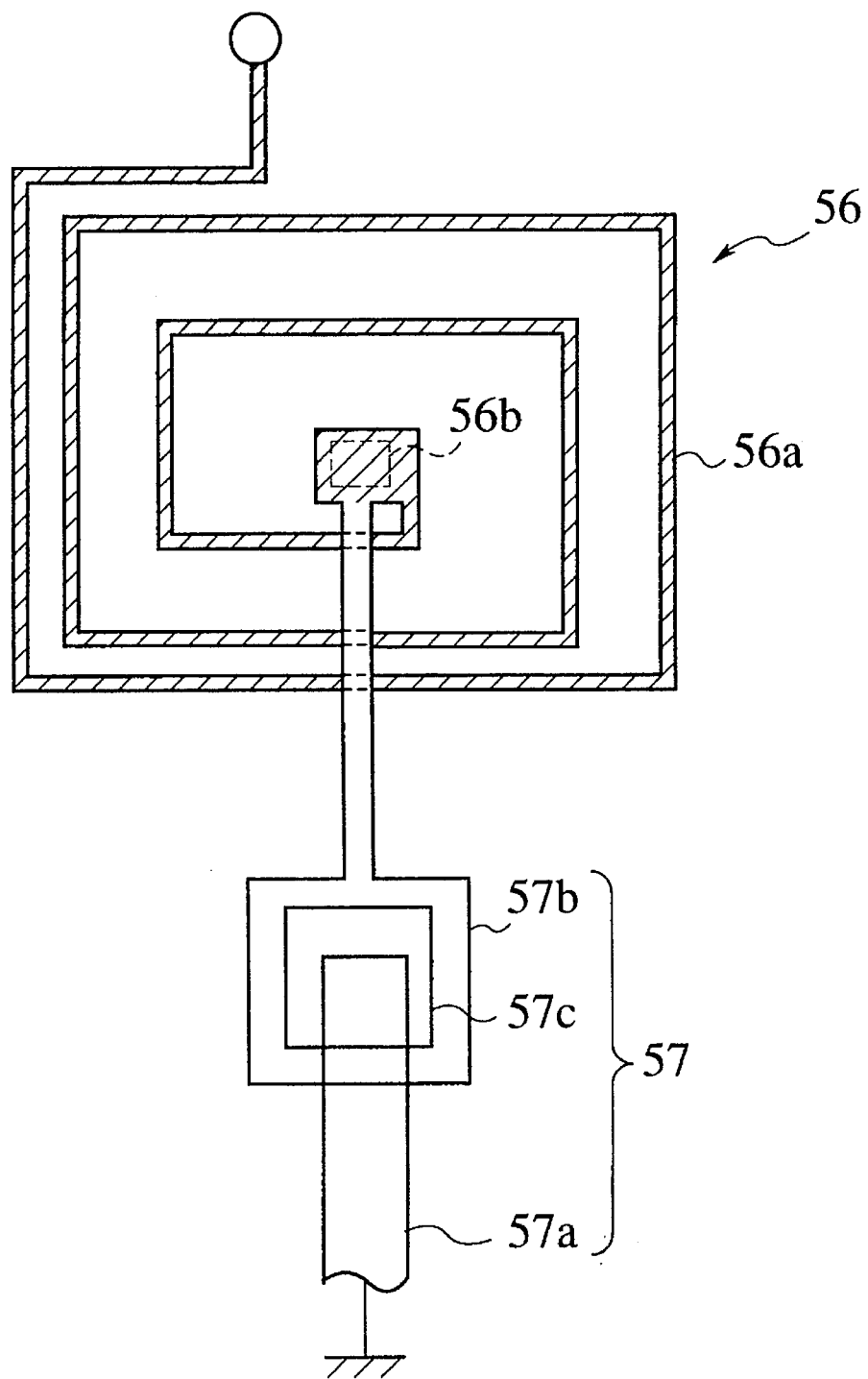
FIG. 3 shows a reactance element (L, C) of an MMIC according to a prior art.
Figure 4:
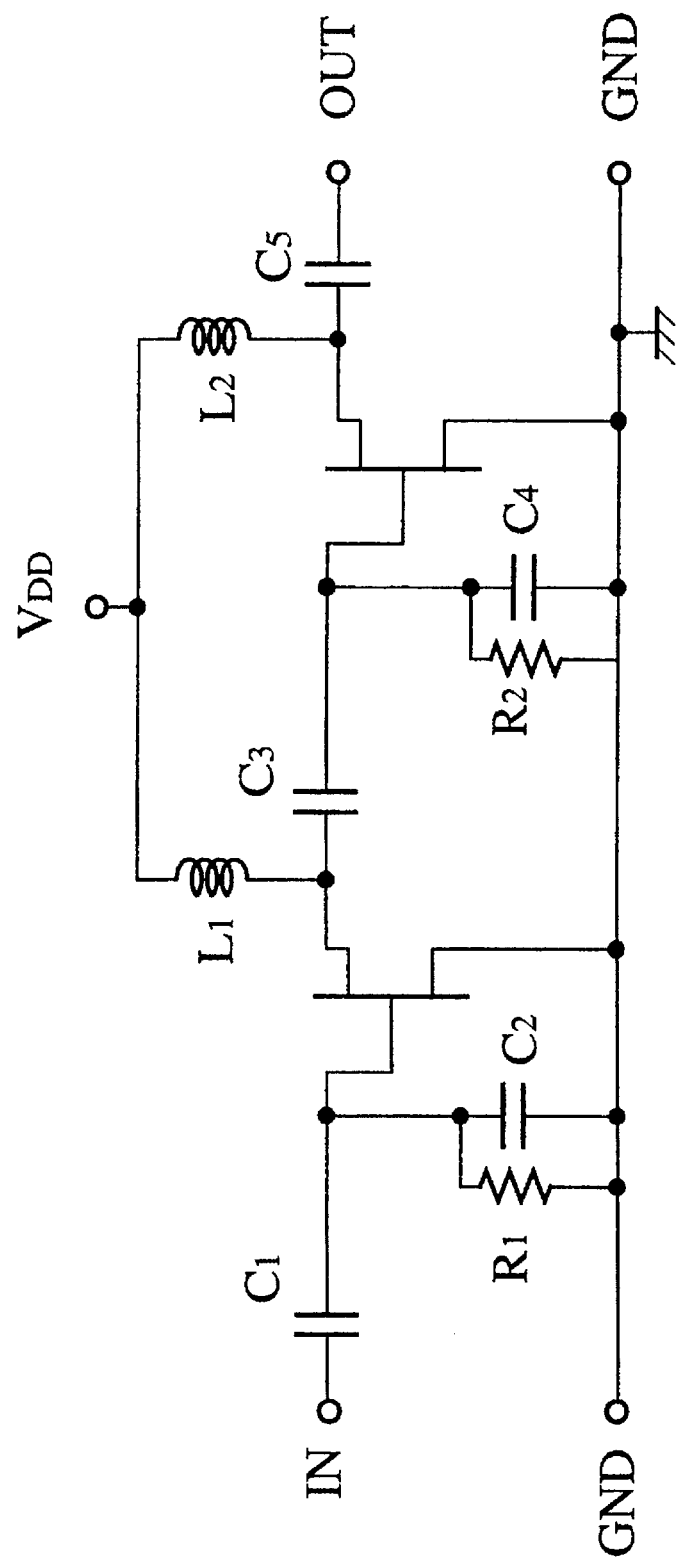
FIG. 4 shows an equivalent circuit of an MMIC.
Figure 5:
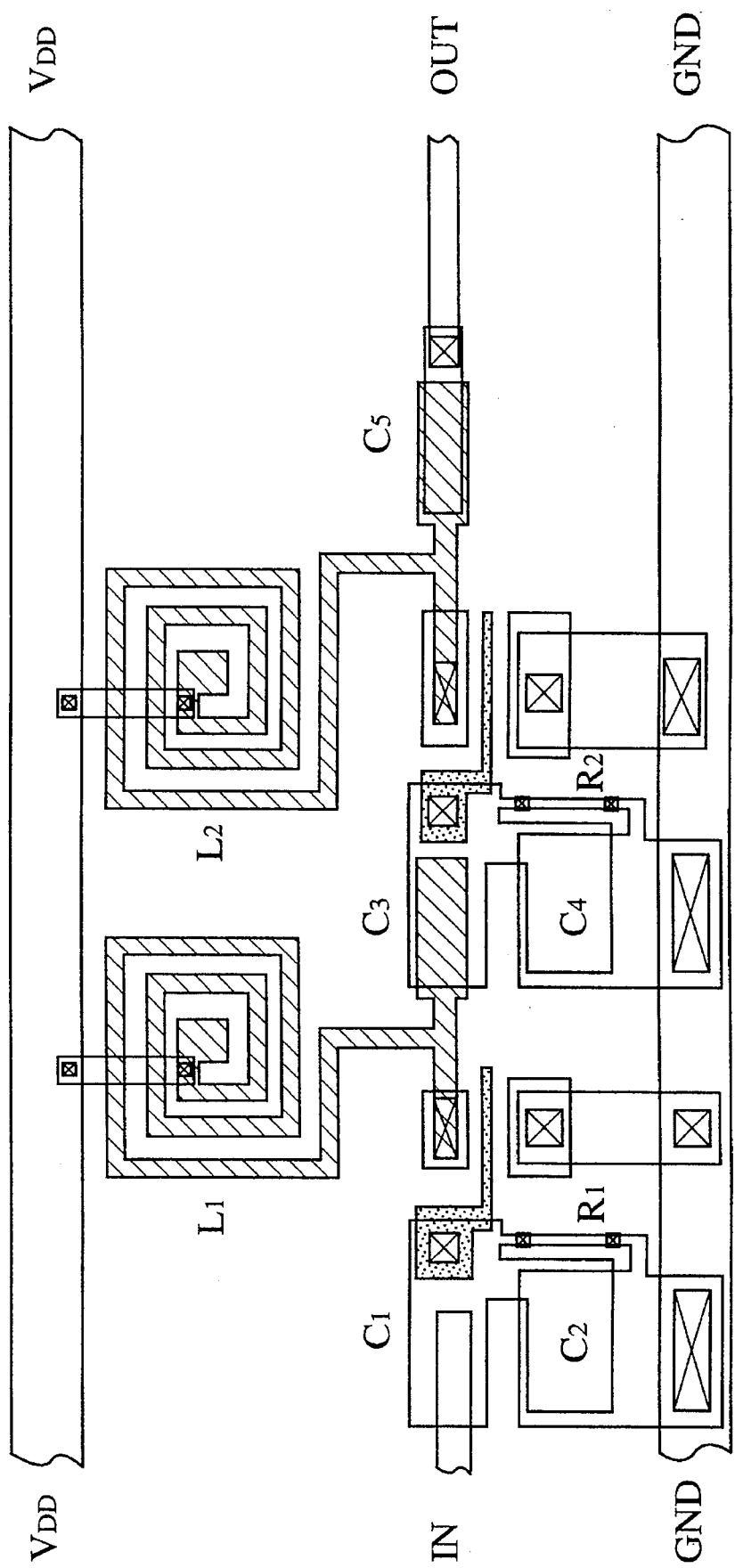
FIG. 5 shows an IC based on the equivalent circuit of FIG. 4.

In a reactance section including the coils and MIM capacitors of the GaAs MMIC of FIG. 9, a connection between the coil 56 and the MIM capacitor 57 will be explained in comparison with the prior art. According to the prior art of FIG. 3, the coil 56 is formed of the spiral wiring metal 56a. The center end of the coil 56 is connected, through the contact hole 56b, to the upper electrode 57b of the MIM capacitor 57 on the surface of the GaAs substrate. On the other hand, the second embodiment of the present invention forms the MIM capacitor 57 on the bottom surface of the GaAs substrate, so that the surface of the chip is required only to secure an area for the coil 56 as shown in FIG. 10, to thereby reduce chip size. The MIM capacitors 57, 62, and 68 of the second embodiment are formed in grooves on the bottom surface of the substrate, similar to the MIM capacitors 24A and 24B of the first embodiment.

Figure 11A:
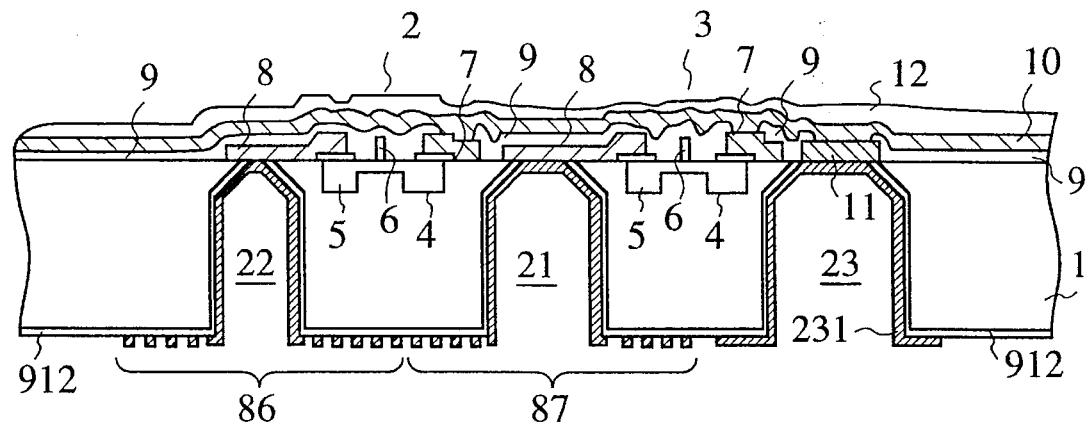
FIGS. 11A to 11C are sectional, top surface, and bottom surface views showing a GaAs MMIC according to a third embodiment of the present invention.
Figure 11B:
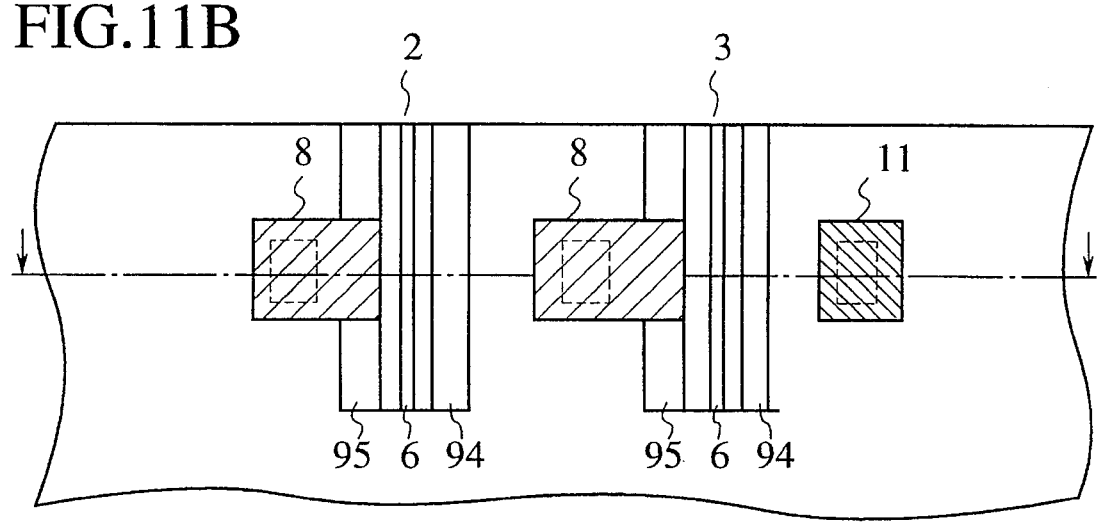
Figure 11C:
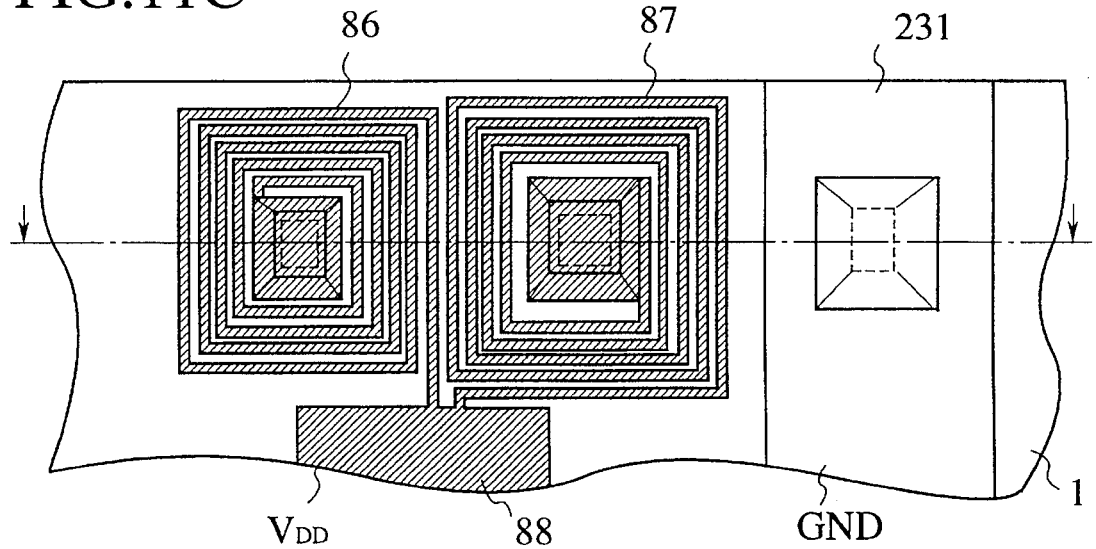

FIGS. 11A, 11B, and 11C are sectional, surface, and bottom surface views showing an MMIC according to the third embodiment of the present invention. The third embodiment forms coils 86 and 87 on the bottom surface of a substrate.

In FIG. 11A, the MMIC has FETs 2 and 3 formed on the surface of the GaAs substrate 1. The FET 2 may be an MESFET having a source region 4 and a drain region 5 both diffused in the substrate 1, and a metal gate electrode 6 formed between the source and drain regions 4 and 5. Ti/Pt/Au, Ti/Al or Silver (Ag) metallization can be used for the gate electrode. The source and drain regions 4 and 5 may be formed in the epitaxial layer prepared by molecular-beam-epitaxy or MOCVD method. The source region 4 is connected to a AuGe/Ni/Au source electrode terminal 7, and the drain region 5 is connected to a AuGe/Ni/Au drain electrode terminal 8. The FET may be a GaAs-GaAlAs HEMT, InAlAs-InGaAs MEMT or a GaAs SIT. The gate electrode 6, source electrode terminal 7, and drain electrode terminal 8 are covered with an interlayer insulation film 9. The source electrode terminal 7 is connected to an aluminum wiring layer 10 through a contact hole. Similar to the FET 2, the FET 3 may be an MESFET. A ground electrode terminal 11 is formed on the surface of the substrate 1. Above the FETs 2 and 3, there is formed a protective passivation film 12. Vertical grooves 21, 22, and 23 are formed on the bottom surface of the substrate 1 up to the drain electrode terminals 8 of the FETs 2 and 3 and the ground electrode terminal 11. The depth of the grooves is 20 to 150 micrometers, the width thereof is 2 to 15 micrometers, and the deepest part of each of the grooves is V-shaped. The wall of each of the grooves 21 and 22 is covered with an insulation film 912, which is covered with an electrode metal layer. The electrode metal layer is made of Al, or Ti—Mo—Au, is used to form the coils 86 and 87, and is connected to the drain electrode terminals 8. The wall of the groove 23 is covered with ground electrode wiring 231 connected to the ground electrode terminal 11. As shown in FIG. 11C, the ground electrode wiring 231 is extended outside the groove 231.

In FIG. 11C, the rectangular spiral coils 86 and 87 are made of Al, or Ti—Mo—Au and are formed on the bottom surface of the substrate 1. The coils 86 and 87 are connected to a power supply terminal 88 connected to a power source $V_{DD}$. A reactance section including the coils 86 and 87 provides required inductance without increasing chip size because the coils 86 and 87 are formed on the bottom surface of the substrate 1. Namely, the third embodiment is capable of providing large inductance with small chip size.

Figure 12:
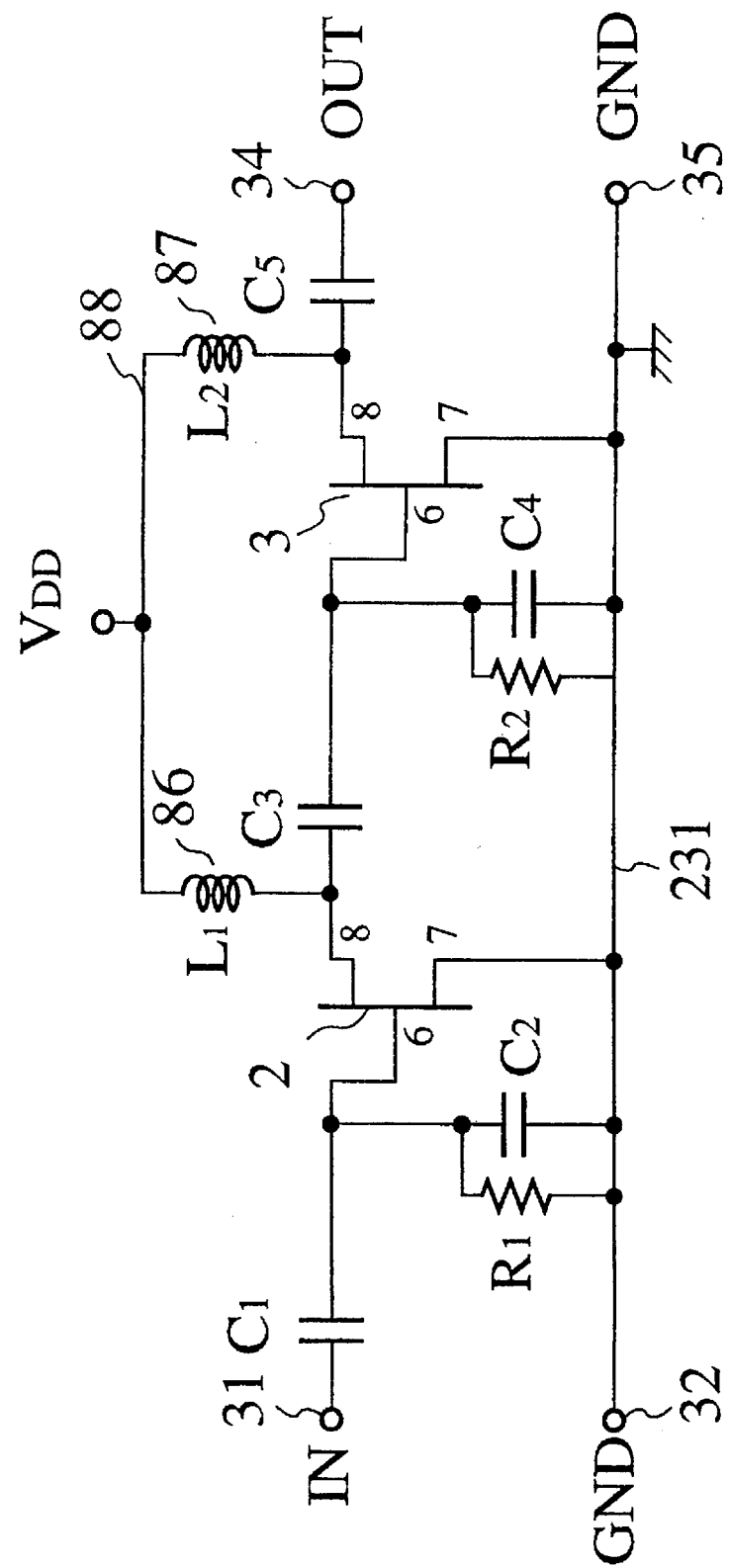
FIG. 12 shows an equivalent circuit of the MMIC of the third embodiment.

FIG. 12 shows an equivalent circuit of the GaAs MMIC of the third embodiment of FIGS. 11A to 11C. This circuit has input terminals 31 and 32 for receiving a microwave signal. The input terminal 31 is connected to the gate of the FET 2 through a capacitor $C_1$, and the input terminal 32 is connected to the ground. The gate 6 of the FET 2 is connected to the ground through a bypass capacitor $C_2$, which is connected to a resistor R1 in parallel. The source 7 of the FET 2 is connected to the ground. The drain 8 of the FET 2 is connected to the power source $V_{DD}$ through the coil 86, and to the gate of the FET 3 through a capacitor $C_3$. The source of the FET 3 is connected to the ground, and the gate thereof is connected to the ground through a bypass capacitor C4 and a resistor $R_2$, which are connected in parallel with each other. The drain of the FET 3 is connected to the power source $V_{DD}$ through the coil 87, and to an output terminal 34 through a capacitor $C_5$. An output terminal 35 is connected to the ground. A microwave signal is received by the input terminals 31 and 32, is high-frequency-amplified by the FETs 2 and 3, and is supplied to the output terminals 34 and 35. The MMIC shown in FIGS. 11A to 11C and 12 can increase the complexity, functionality and compactness of various microwave circuits while providing lower cost.

Figure 13A:
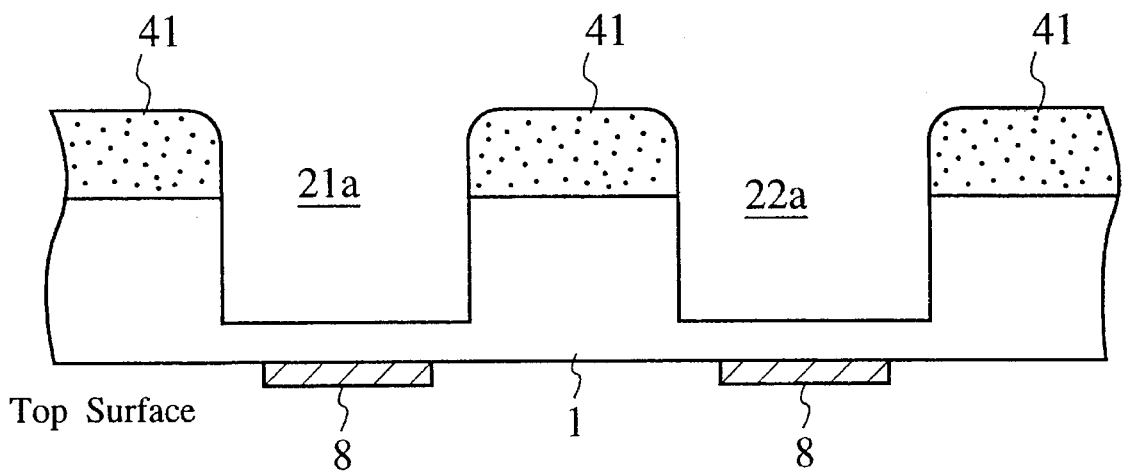
FIGS. 13A to 13C show the steps of manufacturing the MMIC of the third embodiment.
Figure 13B:
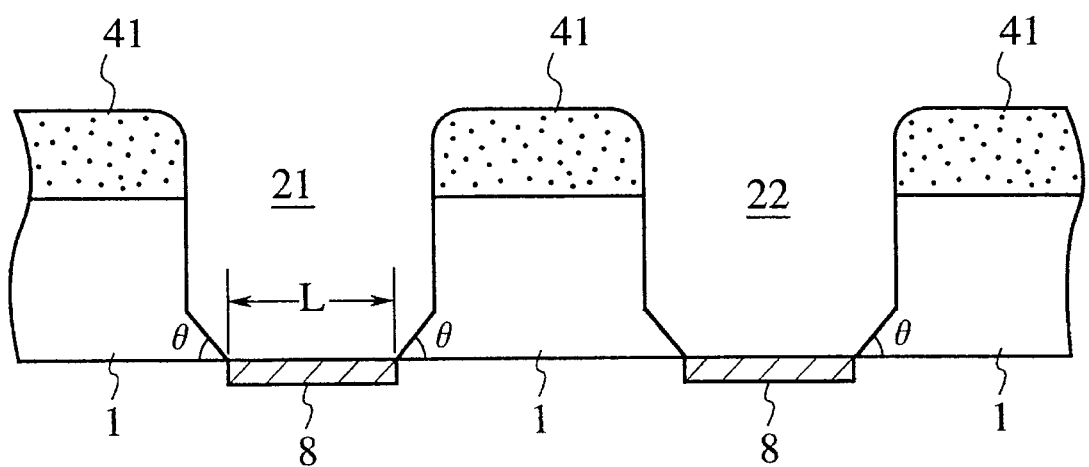
Figure 13C:
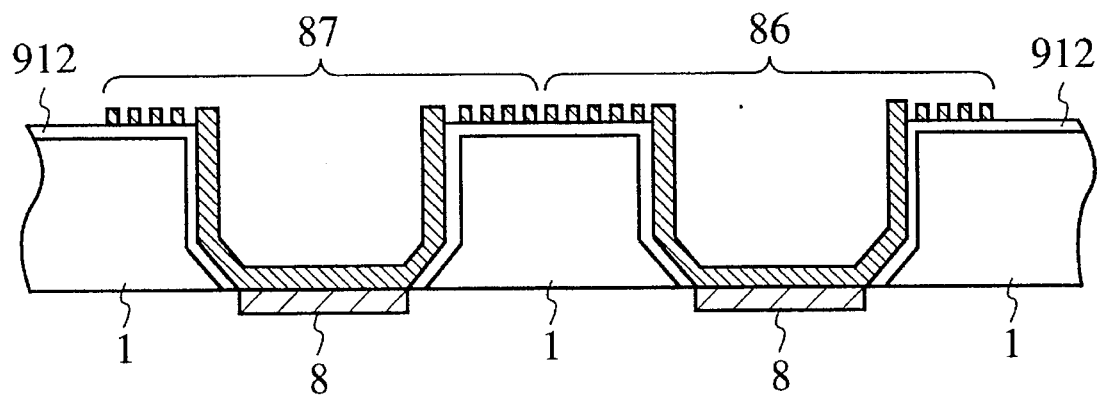

FIGS. 13A to 13C explain a method of manufacturing the GaAs MMIC of FIGS. 11A to 11C. The groove 23 shown in FIG. 11A is omitted in FIGS. 13A to 13C for the sake of simplicity of explanation. Elements other than the drain electrodes 8 of the FETs 2 and 3 are also omitted in the drawings.

(a) In FIG. 13A, MMIC elements such as FETs 2 and 3 are formed on the surface of a GaAs substrate 1. These FETs 2, 3 may be fabricated by the conventional method on a layer structure prepared by molecular-beam-epitaxy (MBE) on semi-insulating GaAs wafer. The structure may consist of a 1-µm thick undoped buffer layer, a thin active layer doped to mid $10^{16}$ cm$^{-3}$ (high-doped layer) and a thick active layer doped to mid $10^{16}$ cm$^{-3}$ (low-doped layer), and an undoped GaAs layer for surface passivation on a C-doped semi-insulating GaAs substrate. But, the details of the fabrication method for the FETs 2, 3 on the top surface of the GaAs substrate 1 are omitted-here, since they do not show the essential feature of the invention. A resist layer 41 of, for example, two micrometers thick is applied to both the top surface and the bottom surface of the substrate 1. The resist layer is patterned by photolithography. The patterned resist layer is used as a mask to carry out selective anisotropic etching such as RIE using $CCl_2F_2$/He mixture, $CCl_4$, $PCl_3$ or $BCl_3$, to form rectangular U grooves 21a and 22a of required depth on the bottom surface of the substrate 1.

(b) In FIG. 13B, selective isotropic etching is carried out on the bottoms of the rectangular U grooves 21a and 22a up to the AuGe/Ni/Au drain electrode terminals 8 of the FETs 2 and 3 on the surface of the substrate 1, so that the side wall of each of the grooves 21a and 22a forms an angle of θ with respect to the surface of the substrate 1. As a result, vertical grooves 21 and 22 each having a V-shaped bottom are formed. Similar to the first embodiment, the angle θ determines the lateral size L of the drain electrode terminal 8. This angle will be 30 degrees if tartaric-acid-based wet etching is carried out. The V-shaped grooves may be formed by photo-excited etching with $Br_2$ or $Cl_2$ gas, using a ultraviolet (UV) light from a high-pressure mercury lamp or ArF, KrF, XeCl, XeF excimer laser. For the photo-excited etching of GaAs, the $SiO_2$ or $Si_3N_4$ film should be used as a mask instead of photoresist 41.

(c) In FIG. 13C, the patterned resist layer 41 is removed. An insulation film 912 is formed from SiO2 or Si3N4 to a thickness of 100 to 300 nanometers by plasma CVD or photo-assisted CVD. The insulation film 912 may be omitted when a semi-insulating GaAs substrate is used. The insulation film 912 on the bottoms of the grooves 21 and 22 is removed by photolithography. A film of W (tungsten) of 100 to 150 nanometers thick is formed on the bottom surface of the substrate and in the grooves 21 and 22 by, for example, spattering. The tungsten film is patterned into rectangular spirals by photolithography, RIE, or CDE. An Au film of 2 to 3 micrometers thick is formed on the patterned tungsten film by selective electrolytic plating, to complete coils 86 and 87. The coils may be formed by forming a film of Al or Ti—Mo—Au of 500 to 1500 nanometers thick by vacuum-vapor deposition, and by selectively etching the deposited film with photolithography. Any one of these techniques may form the MMIC having the cross section of FIG. 13C. If noble metal such as Au or Pt on which the selective etching is hardly carried out are used, the coils 86 and 87 may be patterned by a lift-off method.

As mentioned above, the third embodiment forms the FETs on the surface of the GaAs substrate 1, and the vertical grooves 21, 22, and 23 on the bottom surface of the substrate 1. The embodiment forms the coils 86 and 87 on the bottom surface of the substrate 1 around the grooves 21 and 22. Accordingly, the coils of this embodiment provide large inductance in proportion to the area of the bottom surface of the substrate 1 without increasing chip size.

Figure 14A:
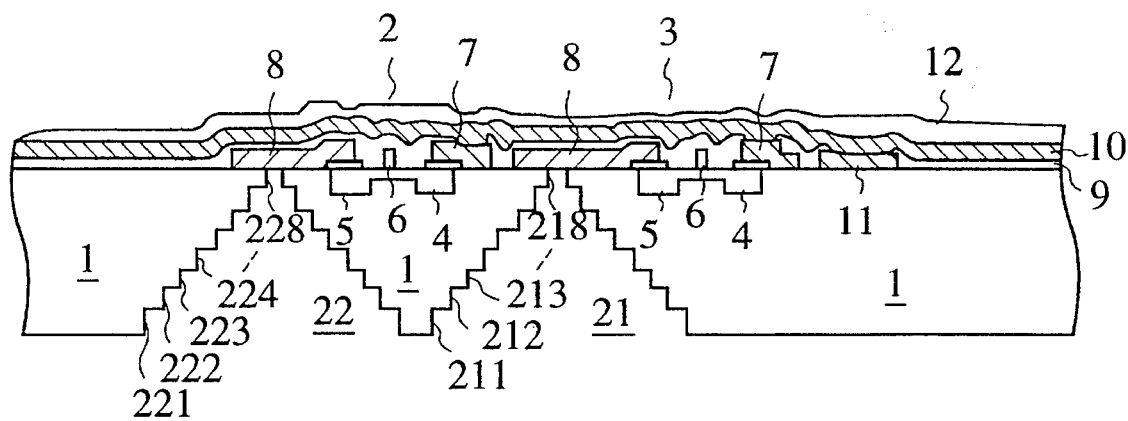
FIGS. 14A to 14C are sectional views showing a GaAs MMIC according to a fourth embodiment of the present invention.
Figure 14B:
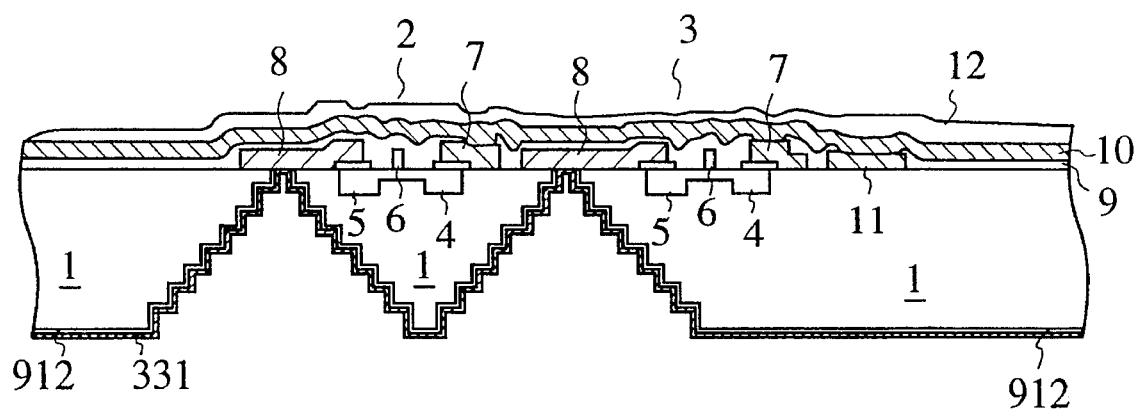
Figure 14C:
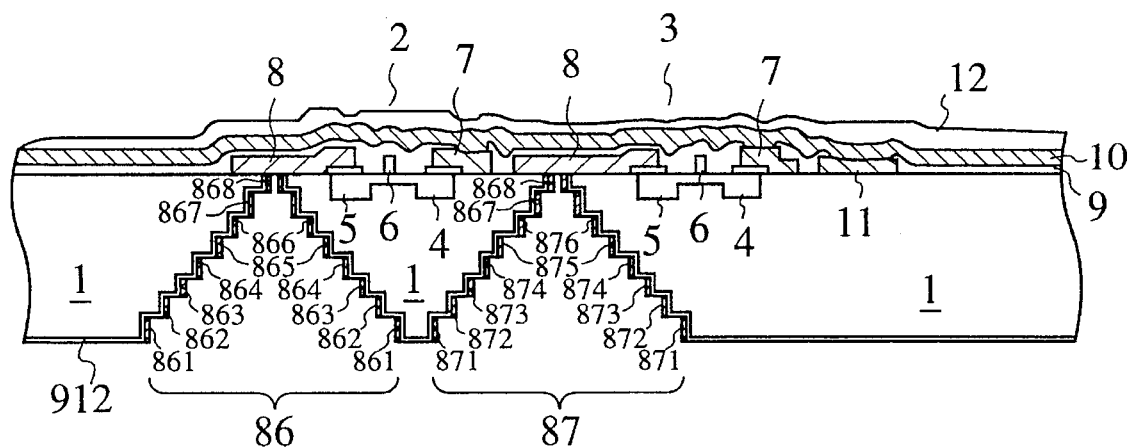

FIG. 14C is a sectional view showing an MMIC according to the fourth embodiment of the present invention, and FIGS. 14A and 14B explain a method of manufacturing this MMIC. The fourth embodiment forms a coil in a stepped groove formed on the bottom surface of a GaAs substrate. In FIG. 14C, FETs 2 and 3 are formed on the surface of the substrate 1. The FETs 2 and 3 may be HBTs or SITs. The FET 2 has a source region 4 and a drain region 5 both diffused in the substrate 1, and a gate electrode 6 between the source and drain regions 4 and 5. The source region 4 is connected to a source electrode terminal 7, and the drain region 5 is connected to a drain electrode terminal 8. The gate electrode 6, source electrode terminal 7, and drain electrode terminal 8 are covered with an interlayer insulation film 9. The source electrode terminal 7 is connected to an aluminum wiring layer 10 through a contact hole. The FET 3 is similar to the FET 2. A ground electrode terminal 11 is formed on the surface of the substrate 1. A protective passivation film 12 is formed above the FETs 2 and 3. Vertical stepped grooves are formed on the bottom surface of the substrate 1 up to the drain electrode terminals 8 of the FETs 2 and 3. The side walls of the grooves have metal rings 861 to 868 and 871 to 878, to form coils 86 and 87, respectively. The metal rings 861 to 868 are connected to one another (not shown) in the groove through metal wiring and to a power source $V_{DD}$. Similarly, the metal rings 871 to 878 are connected to one another (not shown) in the groove through metal wiring and to the power source $V_{DD}$.

The MMIC of the fourth embodiment is manufactured as follows:

(a) In FIG. 14A, MMIC elements such as FETs 2 and 3 are formed on a GaAs substrate 1. The substrate 1 is polished to a thickness of, for example, 24 micrometers. A resist layer 41 of, for example, two micrometers thick is formed over the top and the bottom surface of the substrate 1. The resist layer 41 is patterned by photolithography. The patterned resist layer is used as a mask to etch the substrate to a depth of 3 micrometers by RIE, to thereby form grooves 221 and 211 on the bottom surface of the substrate 1. The patterned resist is removed, and a new resist pattern for grooves 222 and 212 whose inner diameters are smaller than those of the grooves 221 and 211 is formed and patterned by photolithography. The patterned resist layer is used as a mask to form the grooves 222 and 212 of 3 micrometers in depth by RIE. In this way, grooves 223 to 228 and 213 to 218 whose inner diameters gradually decrease are formed by repeating photolithography and RIE. Each RIE is carried out up to a depth of 3 micrometers and is repeated eight times, to form the stepped grooves on the bottom surface of the substrate 1 up to drain electrode terminals 8 of the FETs 2 and 3.

(b) In FIG. 14B, an insulation film 912 is formed, and an aluminum film of 500 nanometers is formed on the stepped grooves and the bottom surface of the substrate 1 by vacuum vapor deposition.

(c) In FIG. 14C, RIE with $CCl_4$, $PCl_3$, $BCl_3$, or $SiCl_4$, or anisotropic etching of high directivity is carried to leave the aluminum film only along the side walls of the steps of the grooves, to form metal rings 861 to 868 and 871 to 878 in a self-aligning manner. Metal such as aluminum is deposited by vacuum vapor deposition, to form wiring patterns to connect the metal rings 861 to 868 to one another, and the metal rings 871 to 878 to one another. This completes the MMIC according to the fourth embodiment.

As mentioned above, the fourth embodiment forms the FETs on the surface of the GaAs substrate 1, the stepped grooves 21 and 22 on the bottom surface of the substrate 1, and the coils 86 and 87 on the side walls of the grooves 21 and 22. The coils provide large inductance without increasing chip size. Although eight steps are shown in FIG. 14C as an example, the number of the steps of the stepped groove should be designed to satisfy the required value of the inductance.

Figure 15:
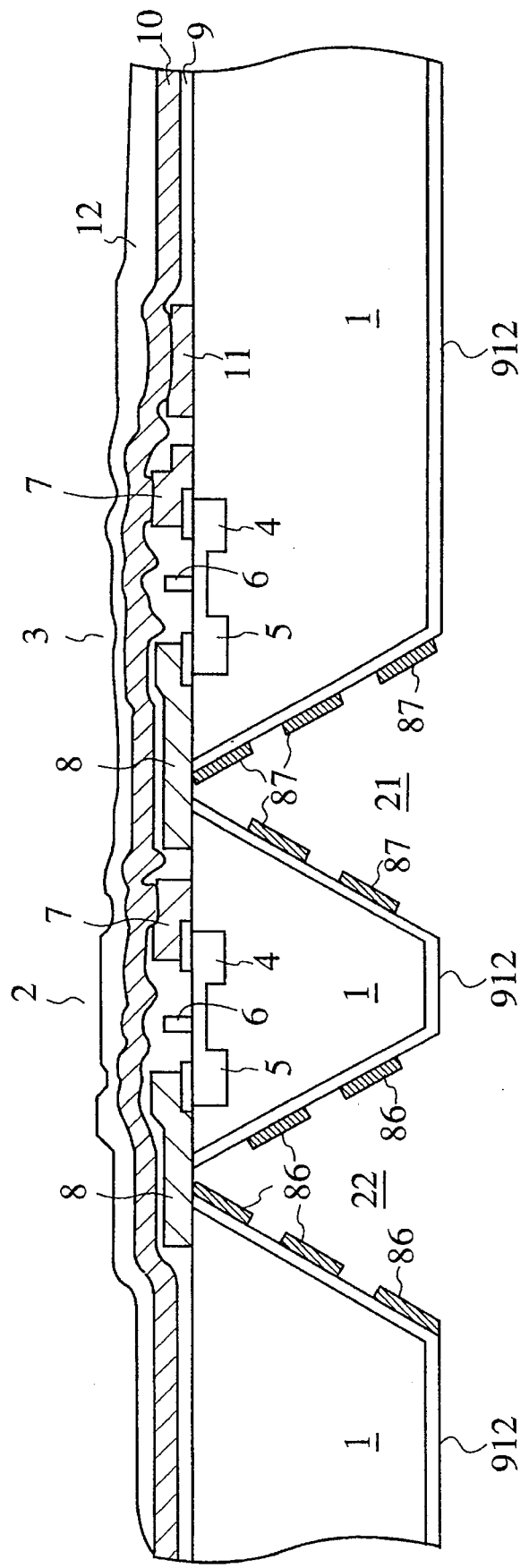
FIG. 15 is a sectional view showing a GaAs MMIC according to a fifth embodiment of the present invention.

FIG. 15 is a sectional view showing an MMIC according to the fifth embodiment of the present invention. Coils 86 and 87 are formed in V-shaped grooves formed on the bottom surface of a GaAs substrate 1. MMIC elements such as FETs 2 and 3 are formed on the surface of the substrate 1. The FET 2 has a source region 4 and a drain region 5 both diffused in the substrate 1, and a gate electrode 6 formed between the source and drain regions 4 and 5. The FET 2 may be a some-kind of advanced GaAs MESFET such as Self-Aligned Implantation for N+-layer Technology (SAINT) FET. The drain region 5 is connected to a drain electrode terminal 8. The gate electrode 6, source electrode terminal 7, and drain electrode terminal 8 are covered with an intermediate insulation film 9. The SAINT FET fabrication process is almost the same as the conventional GaAs MESFET except for gate formation. The gate electrode formation process involves the following steps: 1) Mo and Au are deposited onto the whole surface by sputtering; 2) the Au surface is planarized by ion beam milling with a large beam incident angle; and 3) using this Au pattern as the etching mask, Mo film is selectively etched by RIE. Consequently, the gate electrode is embedded in a self-aligned manner only in the gate contact region. After gate formation, source and drain ohmic electrodes were formed by AuGe/Ni deposition and sintering. The source electrode terminal 7 is connected to an aluminum wiring layer 10 through a contact hole. The FET 3 may be identical to the SAINT FET 2. A ground electrode terminal 11 is formed on the surface of the substrate 1. A protective passivation film 12 is formed above the FETs 2 and 3. The V-shaped grooves 21 and 22 are formed on the bottom surface of the substrate 1 up to the drain electrode terminals 8 of the FETs 2 and 3. The spiral coils 86 and 87 are formed on the side walls of the grooves 21 and 22, respectively. Although the coils 86 and 87 are shown as if partly cut in FIG. 15 because the drawing shows a sectional view, each of the coils actually has a continuous spiral shape. Similar to the third embodiment, the spiral coils in the V-shaped grooves are formed by forming a tungsten (W) base film, patterning the tungsten film, and electrolytically plating Au to a thickness of 2 to 3 micrometers on the patterned tungsten film. Instead, metal may be deposited over the side walls of the grooves by vacuum vapor deposition, and the deposited metal may be patterned by photolithography and RIE.

As mentioned above, the fifth embodiment forms the FETs on the surface of the GaAs substrate 1, the V-shaped grooves 21 and 22 on the bottom surface of the substrate 1, and the spiral coils 86 and 87 along the inner walls of the grooves 21 and 22. These coils provide large inductance without increasing chip size.

Figure 16:
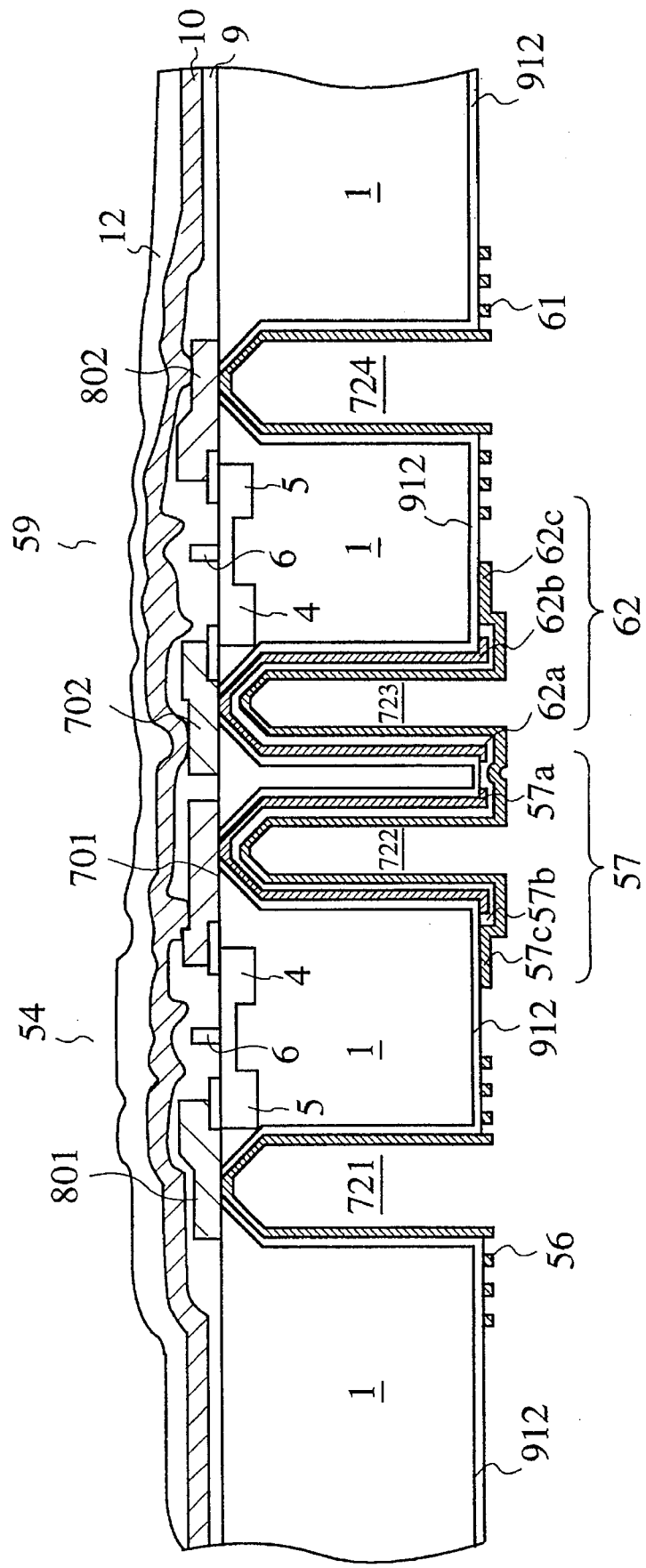
FIG. 16 is a sectional view showing a GaAs MMIC according to a sixth embodiment of the present invention.

FIG. 16 is a sectional view showing an MMIC according to the sixth embodiment of the present invention. MIM capacitors 57 and 62 and coils 56 and 61 are formed on the bottom surface of a GaAs substrate. Unlike the second embodiment that forms coils on the surface of a substrate, the sixth embodiment forms coils and MIM capacitors on the bottom surface of a substrate, to further improve area efficiency. An equivalent circuit of the arrangement of FIG. 16 is the same as that of FIG. 9 of the second embodiment. In FIG. 16, MMIC elements such as FETs 54 and 59 are formed on the surface of the GaAs substrate 1. The FET 54 is a GaAs MESFET having a source region 4 and a drain region 5 both diffused in the substrate 1, and a metal gate electrode 6 formed between the source and drain regions 4 and 5. The FET 54 may be a recessed gate MESFET or a SAINT FET. The source region 4 is connected to a source electrode terminal 701, and the drain region 5 is connected to a drain electrode terminal 801. The gate electrode 6, source electrode terminal 701, and drain electrode terminal 801 are covered with an interlayer insulation film 9. The source electrode terminal 701 is connected to an aluminum wiring layer 10 through a contact hole. Similar to the FET 54, the FET 59 is a GaAs MESFET. A protective passivation film 12 is formed above the FETs 54 and 59. Although FIG. 9 shows the FET 64 and coil etc., FIG. 16 does not show them for the sake of simplicity. Vertical grooves 721, 722, 723, and 724 each having a V-shaped end are formed on the bottom surface of the substrate 1. These grooves have a depth of 20 to 150 micrometers and a width of 2 to 15 micrometers and reach the source electrode terminals 701 and 702 and drain electrode terminals 801 and 802 of the FETs 54 and 59, respectively. On the walls of the grooves 722 and 723, there are formed an insulation film 912, lower electrode layers 57a and 62a, insulation films 57b and 62b, and upper electrode layers 57c and 62c in this order, to form the MIM capacitors 57 and 62. The lower electrode layers 57a and 62a are connected to the source electrode terminals 701 and 02 of the FETs 54 and 59, respectively.

The lower electrode layers 57a and 62a are formed of a lamination of a Ti film of 50 nanometers thick, an Mo film of 50 nanometers thick, and an Au film of 500 nanometers thick. The upper electrode layers 57c and 62c are formed of an Al film of 500 to 1500 nanometers thick, or a lamination of a Ti film of 50 nanometers thick, an Mo film of 50 nanometers thick, and an Au film of 1.5 micrometers thick. Alternatively, the upper electrode layers 57C and 62C may be formed of a tungsten (W) film of 150 to 200 nanometers thick and an Au film of 2 to 3 micrometers thick formed on the tungsten film by electrolytic plating. The insulation films 57b and 62b are formed by growing an $Si_3N_4$ film of 100 nanometers thick. The upper electrode layers 57c and 62c are connected to each other. On the walls of the grooves 721 and 724, there are formed an insulation layer 912 and an electrode metal layer. The electrode metal layer is formed from Al, or Ti—Mo—Au, or W—Au, is used to form the coils 56 and 61, and is connected to the drain electrode terminals 801 and 802 on the surface of the substrate 1, respectively. The spiral coil 56 is formed around the groove 721, and the spiral coil 61 is formed around the groove 724. Similar to the third embodiment, the spiral coils 56 and 61 are formed by patterning a tungsten film of 150 to 200 nanometers thick by photolithography and RIE and by forming an Au film of 2 to 3 micrometers thick thereon by selecting plating. The spiral coils 56 and 61 are connected to each other on the bottom surface of the substrate 1 and to the upper electrode layers 57c and 62c of the MIM capacitors.

As mentioned above, the sixth embodiment forms the vertical grooves 721 to 724 on the bottom surface of the GaAs substrate 1 up to the electrode terminals 701,702, 801, and 802, respectively. This embodiment also forms the MIM capacitors 57 and 62 and spiral coils 56 and 61 in the grooves and on the bottom surface of the substrate and connect them to the electrode terminals 701,702,801, and 802, respectively. The MIM capacitors and spiral coils provide large capacitance and inductance in proportion to the area of the bottom surface of the substrate without increasing chip size. Similar to the first embodiment, the capacitors and coils may be connected to a ground terminal of the MMIC on the bottom surface of the substrate. This arrangement prevents a rise of ground potential in a high-frequency small signal device due to large resistance, to thereby improve amplifying or signal-generating characteristics. The approach shown by the sixth embodiment simplify the system designs while reducing overall system size, weight, and cost.

Various modifications will become possible for those skilled in the art after receiving the teachings of the present disclosure without departing from the scope thereof. Although the basic building block of MMICs of the first to sixth embodiments employ GaAs MESFETs, as pointed out here and there, the active elements of the MMICs according to the present invention may be GaAs MISFETs with AlGaAs gate insulators, GaAs HEMTs, GaAs bipolar transistors such as HBTs, or GaAs SITs. Employing ideal SITs realizing ballistic operation will provide an MMIC that operates in a terahertz band. The active elements may be mesoscopic-scale elements using tunnel injection effect. The active elements may be made of not only GaAs but also compound semiconductor such as InP, InSb, InAs, GaAlAs, GaAsSb, InGaP, and SiC, and single-element semiconductor such as Si and Ge. If Si is used, it is preferable to employ MOSFETs, MOS-SITs, or CMOS transistors. As explained with reference to the first embodiment, the insulation film 912 in the grooves and on the bottom surface of a substrate may be omitted when a semi-insulating GaAs substrate is employed. When an Si substrate is employed, the insulation film 912 must be formed from, for example, $SiO_2$ or $Si_3N_4$.

The MMIC of the present invention is suitable for wireless personal communication systems such as pagers, wireless modems, wireless local area networks, as well as defense related applications in portable communications which require low unit cost, light weight, and long battery lifetime. The compactness and functionality of the MMIC by present invention will satisfy various microwave circuit requirements such as a power amplifier, low noise amplifier, linear amplifier, wideband amplifier and oscillators.

What is claimed is:
1. An integrated circuit comprising:
   (a) a semiconductor substrate;
   (b) at least an active element formed on a first principal surface of said substrate;
   (c) a groove formed on a second principal surface of said substrate up to the first principal surface thereof; and
   (d) an MIC capacitor having a first electrode layer formed on at least the side wall of said groove, an insulation film formed on the first electrode layer, and a second electrode layer formed on the insulation film, so that the first and second electrode layers are disposed in the groove and facing each other through the insulation film.

2. An integrated circuit as claimed in claim 1, wherein the deepest part of said groove in the vicinity of the first principal surface is V-shaped, each side wall of the V-shaped part forms an angle of θ smaller than 90 degrees with respect to the first principal surface, and the sidewall of said groove is perpendicular to the second principal surface at the opening part of said groove in the vicinity of the second principal surface.

3. An integrated circuit as claimed in claim 2, wherein the angle θ is 30 degrees.

4. An integrated circuit as claimed in claim 1, wherein:
   said active element is a transistor having first and second main electrode terminals and a control electrode terminal;
   said groove is formed under and in contact with the first main electrode terminal; and
   the first electrode layer is connected to the first main electrode terminal.

5. An integrated circuit comprising:
   (a) a semiconductor substrate;
   (b) at least an active element formed on a first principal surface of said substrate;
   (c) a groove formed on a second principal surface of said substrate up to the first principal surface thereof; and
   (d) a spiral coil formed on the second principal surface in the vicinity of said groove and connected to said active element through a metal layer formed on the inner wall of said groove.

6. An integrated circuit comprising:
   (a) a semiconductor substrate;
   (b) at least an active element formed on a first principal surface of said substrate;
   (c) a groove formed on a second principal surface of said substrate up to the first principal surface thereof; and
   (d) a coil formed in said groove.

7. An integrated circuit as claimed in claim 5, wherein:
   said active element is a transistor having first and second main electrode terminals and a control electrode terminal;
   said groove is formed under and in contact with the first main electrode terminal; and
   the coil is connected to the first main electrode terminal.

8. An integrated circuit as claimed in claim 1, wherein said MIM capacitor is connected on the second principal surface, to a power source electrode terminal formed on the second principal surface.

9. An integrated circuit as claimed in claim 1, further comprising a ground terminal formed on the first principal surface, a ground-groove formed on the second principal surface up to the first principal surface under the ground terminal, and a wiring layer formed on the inner wall of the ground-groove, the wiring layer electrically connecting the ground terminal on the first principal surface to a ground wiring layer formed on the second principal surface.

10. An integrated circuit as claimed in claim 9, wherein the wiring layer is extended onto the second principal surface and forms an ohmic contact with said substrate through a contact hole formed on the second principal surface.

11. An integrated circuit comprising:
   a semiconductor substrate having first and second principal surfaces;

a transistor having first and second main electrode terminals and a control electrode terminal formed on the first principal surface of said substrate;

a first groove formed on the second principal surface up to the first principal surface under the first main electrode terminal;

a second groove formed on the second principal surface up to the first principal surface under the second main electrode terminal;

a MIM capacitor formed in at least the first groove and connected to the first main electrode terminal; and a coil formed on at least one of an inner wall of the second groove and the second principal surface around the second groove and connected to the second main electrode terminal.

12. An integrated circuit comprising:

(a) a semiconductor substrate;

(b) a first transistor formed on the first principal surface of said substrate, having first and second main electrode regions, first and second main electrode terminals connected to the first and second main electrode regions, respectively, and a first control electrode terminal formed between the first and second main electrode regions;

(c) a second transistor formed on the first principal surface of said substrate, having third and fourth main electrode regions, third and fourth main electrode terminals connected to the third and fourth main electrode regions, respectively, and a second control electrode terminal formed between the third and fourth main electrode regions;

(d) a first metal wiring layer connecting the first and third main electrode terminals to each other;

(e) a first groove formed on the second principal surface of said substrate up to the first main electrode terminal;

(f) a second groove formed on the second principal surface of said substrate up to the second main electrode terminal;

(g) a third groove formed on the second principal surface of said substrate up to the third main electrode terminal;

(h) a fourth groove formed on the second principal surface of said substrate up to the fourth main electrode terminal;

(i) first and second MIM capacitors formed in said first and third grooves, respectively;

(j) first and second coils formed on the second principal surface around said second and fourth grooves, respectively;

(k) a second metal wiring layer formed in said second groove, to connect the second main electrode terminal and said first coil to each other; and (l) a third metal wiring layer formed in said fourth groove, to connect the fourth main electrode layer and said second coil to each other.

13. An integrated circuit as claimed in claim 12, wherein each of said first to fourth grooves has V-shaped part in the vicinity of the first principal surface, each side wall of the V-shaped part forms an angle of θ smaller than 90 degrees with respect to the first principal surface, and side wall of said first to fourth grooves are substantially vertical to the second principal surface in the vicinity of the second principal surface.

14. An integrated circuit as claimed in claim 12, wherein:

said first MIM capacitor has a first lower electrode layer formed on at least the inner wall of said first groove, a first insulation film formed on the first lower electrode layer, and a first upper electrode layer formed on the first insulation film, so that the first lower and upper electrode layers face each other through the first insulation film; and said second MIM capacitor has a second lower electrode layer formed on at least the inner wall of said third groove, a second insulation film formed on the second lower electrode layer, and a second upper electrode layer formed on the second insulation film, so that the second lower and upper electrode layers face each other through the second insulation film.

15. An integrated circuit as claimed in claim 14, wherein:

said substrate is a semi-insulating GaAs substrate;

the first, second, third, and fourth main electrode regions are high-impurity-concentration regions formed in said substrate or an epitaxial layer on said substrate;

the first control electrode terminal is a first metal gate electrode terminal formed on a first channel region disposed between the first and second main electrode regions; and the second control electrode terminal is a second metal gate electrode terminal formed on a second channel region disposed between the third and fourth main electrode regions.

16. An integrated circuit as claimed in claim 6, wherein the deepest part of said groove in the vicinity of the first principal surface is V-shaped, each side wall of the V-shaped part forms an angle of θ smaller than 90 degrees with respect to the first principal surface, and the sidewall of said groove is perpendicular to the second principal surface at the opening part of said groove in the vicinity of the second principal surface.

17. An integrated circuit as claimed in claim 16, wherein the angle θ is 30 degrees.

18. An integrated circuit as claimed in claim 5 or 6, wherein said spiral coil is connected, on the second principal surface, to a power source electrode terminal formed on the second principal surface.

19. An integrated circuit as claimed in claim 5 or 6, further comprising a ground terminal formed on the first principal surface, a ground-groove formed on the second principal surface up to the first principal surface under the ground terminal, and a wiring layer formed on the inner wall of the ground-groove, the wiring layer electrically connecting the ground terminal on the first principal surface to a ground wiring layer formed on the second principal surface.

20. An integrated circuit as claimed in claim 19, wherein the wiring layer is extended onto the second principal surface and forms an ohmic contact with said substrate through a contact hole formed on the second principal surface.

* * * * *